(12) United States Patent
Yoo

(10) Patent No.: US 10,390,432 B2
(45) Date of Patent: Aug. 20, 2019

(54) CIRCUIT BOARD MODULE FOR DISPLAY DEVICE, METHOD FOR MANUFACTURING THE SAME, AND DISPLAY DEVICE

(71) Applicant: LG Display Co., Ltd., Seoul (KR)

(72) Inventor: YeonTaek Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/853,180

(22) Filed: Dec. 22, 2017

(65) Prior Publication Data

US 2018/0184523 A1 Jun. 28, 2018

(30) Foreign Application Priority Data

Dec. 27, 2016 (KR) .................. 10-2016-0179764

(51) Int. Cl.
| | |
|---|---|
| *H05K 1/18* | (2006.01) |
| *H05K 1/14* | (2006.01) |
| *H05K 1/02* | (2006.01) |
| *H05K 1/11* | (2006.01) |
| *H05K 3/36* | (2006.01) |
| *H05K 3/30* | (2006.01) |

(52) U.S. Cl.
CPC ............ *H05K 1/147* (2013.01); *H05K 1/028* (2013.01); *H05K 1/111* (2013.01); *H05K 1/18* (2013.01); *H05K 3/30* (2013.01); *H05K 3/361* (2013.01); *H05K 2201/10128* (2013.01); *H05K 2201/10962* (2013.01)

(58) Field of Classification Search
USPC ........................................... 361/749
See application file for complete search history.

(56) References Cited

U.S. PATENT DOCUMENTS

| | | | |
|---|---|---|---|
| 2007/0126971 A1* | 6/2007 | Lo ...................... | G02F 1/13452 349/149 |
| 2012/0044221 A1 | 2/2012 | Ko et al. | |
| 2016/0198560 A1* | 7/2016 | Shin ...................... | H05K 1/028 362/600 |

FOREIGN PATENT DOCUMENTS

| | | |
|---|---|---|
| KR | 10-2012-0057712 | 6/2012 |
| KR | 10-1509019 B1 | 4/2015 |

* cited by examiner

*Primary Examiner* — Andargie M Aychillhum
(74) *Attorney, Agent, or Firm* — Polsinelli PC

(57) ABSTRACT

Disclosed is an circuit board module for a display device having a rigid-flex circuit board structure which is capable of improving spatial efficiency of a mother board, and simplifying a structure of the mother board, a method for manufacturing the same, and a display device, wherein a rigid-flex printed circuit board, a rigid printed circuit board, and a flexible printed circuit cable are respectively manufactured on the different mother boards, separately, and then combined with one another, whereby it is possible to realize the more-improved spatial efficiency of the mother board in comparison to a case of manufacturing the rigid-flex printed circuit board, the rigid printed circuit board, and the flexible printed circuit cable on one mother board.

20 Claims, 7 Drawing Sheets

CIRCUIT BOARD MODULE FOR DISPLAY DEVICE, METHOD FOR MANUFACTURING THE SAME, AND DISPLAY DEVICE

CROSS REFERENCE TO RELATED APPLICATION

This application claims the benefit of the Korean Patent Application No. 10-2016-0179764 filed on Dec. 27, 2016, which is hereby incorporated by reference as if fully set forth herein.

BACKGROUND

Field of the Disclosure

The present disclosure relates to a display device, and more particularly, to a circuit board module for a display device, a display device including the same, and a method for manufacturing the same.

Description of the Background

With the advancement of information society, a display field for displaying video information has been developed rapidly, so that various display devices have been researched actively. Herein, various technologies for the display devices relate to thin profile, light weight, and reduced power consumption. As the related technologies are developed, an application field of the display devices becomes wider. The display device may be used as a user interface in electronic devices or mobile devices.

A circuit board module for a display device is a set of boards on which circuits for driving a display device are mounted as a type of integrated circuit (IC) or a chip. The circuit board module for a display device includes a control printed circuit board (C-PCB) for controlling driving timing of the display device and supplying information on an image to be displayed on the display device by supplying digital video data and timing signals, and a source printed circuit board (S-PCB) for supplying an analog data voltage to the display device.

The control printed circuit board (C-PCB) and the source printed circuit board (S-PCB) may be connected with a flexible printed circuit cable (Flex) having flexibility. The control printed circuit board (C-PCB) and the source printed circuit board (S-PCB) are rigid boards. The circuit board module for a display device where the control printed circuit board (C-PCB) and the source printed circuit board (S-PCB) are connected by the use of flexible printed circuit cable (Flex) is defined as a rigid-flex circuit board.

According to the related art, if the circuit board module for a display device is formed of the rigid-flex circuit board, the circuit board module for a display device is formed as one body with the control printed circuit board (C-PCB), the source printed circuit board (S-PCB), and the flexible printed circuit cable on one mother board. That is, the control printed circuit board (C-PCB) and the source printed circuit board (S-PCB) are formed on rigid portions of the circuit board module for a display device and are provided in such a way that the control printed circuit board (C-PCB) and the source printed circuit board (S-PCB) are connected with remaining portions of the circuit board module for a display device by the use of flexible printed circuit cable. In this case, a shape of the circuit board module for a display device causes a large empty space on the mother board, which lowers spatial efficiency of the mother board. Also, the flexible printed circuit cable has to be provided on the mother board, which causes a complicated structure of the mother board.

SUMMARY

Accordingly, the present disclosure is directed to a circuit board module for a display device that substantially obviates one or more problems due to limitations and disadvantages of the related art, a display device including the same, and a method for manufacturing the same.

An aspect of the present disclosure is directed to provide a circuit board module for a display device having a rigid-flex circuit board structure which is capable of improving spatial efficiency of a mother board, and simplifying a structure of the mother board, a display device including the same, and a method for manufacturing the same.

Additional advantages and features of aspects of the disclosure will be set forth in part in the description which follows and in part will become apparent to those having ordinary skill in the art upon examination of the following or may be learned from practice of aspects of the disclosure. Other advantages of aspects of the disclosure may be realized and attained by the structure particularly pointed out in the written description and claims hereof as well as the appended drawings.

To achieve these and other advantages and in accordance with the purpose of aspects of the disclosure, as embodied and broadly described herein, there is provided a circuit board module for a display device that may include a rigid-flex printed circuit board having a rigid portion and a plurality of flexible portions, a plurality of flexible printed circuit cables attached to the rigid portion of the rigid-flex printed circuit board, and a rigid printed circuit board to which the plurality of flexible printed circuit cables are attached.

In another aspect of the present disclosure, there is provided a display device that may include a display panel having a panel pad portion, and a circuit board module for a display device connected with the panel pad portion.

In yet another aspect of the present disclosure, there is provided a method for manufacturing a circuit board module for a display device that may include manufacturing a rigid-flex printed circuit board having a rigid portion and a plurality of flexible portions by the use of first mother board, manufacturing a rigid printed circuit board by the use of second mother board, manufacturing a plurality of flexible printed circuit cables by the use of third mother board, and attaching the plurality of flexible printed circuit cables to the rigid portion of the rigid-flex printed circuit board and the rigid printed circuit board.

It is to be understood that both the foregoing general description and the following detailed description of aspects of the present disclosure are exemplary and explanatory and are intended to provide further explanation of the disclosure as claimed.

BRIEF DESCRIPTION OF THE DRAWINGS

The accompanying drawings, which are included to provide a further understanding of aspects of the disclosure and are incorporated in and constitute a part of this application, illustrate aspect(s) of the disclosure and together with the description serve to explain the principle of aspects of the disclosure.

In the drawings.

DETAILED DESCRIPTION

Figure 1:
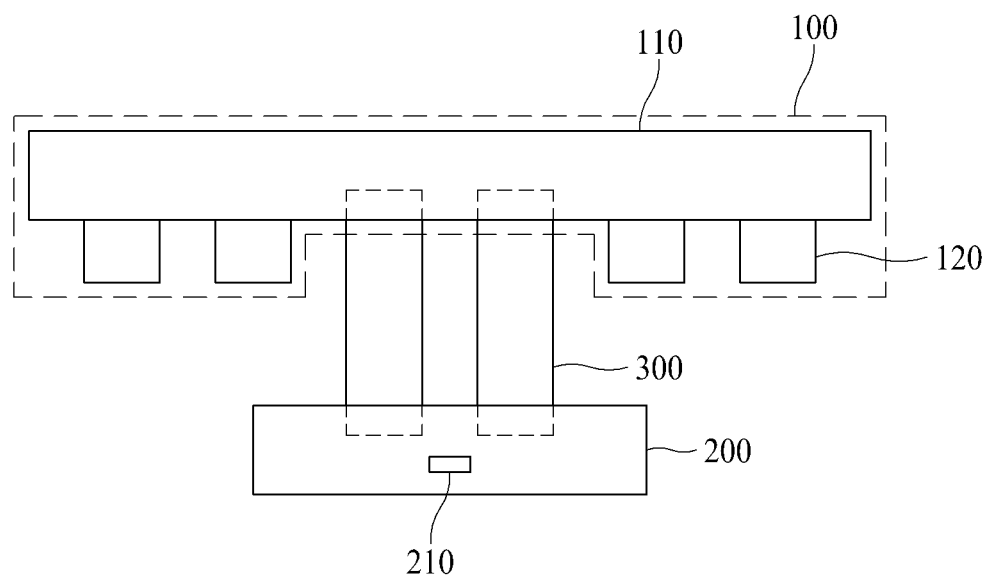
FIG. 1 is a plan view illustrating a circuit board module for a display device according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims. A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, a circuit board module for a display device according to an aspect of the present disclosure, a display device including the same, and a method for manufacturing the circuit board module for a display device will be described in detail with reference to the accompanying drawings.

FIG. 1 is a plan view illustrating a circuit board module for a display device according to an aspect of the present disclosure. The circuit board module for a display device according to an aspect of the present disclosure may include a rigid-flex printed circuit board 100, a rigid printed circuit board 200, and a plurality of flexible printed circuit cables 300.

The rigid-flex printed circuit board 100 may include a rigid portion 110, and a plurality of flexible portions 120. The rigid-flex printed circuit board 100 is formed in a horizontally-long shape, and the rigid portion 110 is formed in a horizontally-long rectangular shape. The plurality of flexible portions 120 protrudes from a long side of the rigid portion 110. FIG. 1 shows the four flexible portions 120, but not limited to this structure. The number of flexible portions 120 may be more than four, or less than four.

The rigid-flex printed circuit board 100 may be a source printed circuit board (S-PCB) for supplying an analog data voltage to a display panel. The rigid-flex printed circuit board 100 may supply the data voltage to the display panel by the use of flexible portions 120.

The rigid printed circuit board 200 is attached to one end of each of the plurality of flexible printed circuit cables 300, and the other end of each of the plurality of flexible printed circuit cables 300 is attached to a long side of the rigid-flex printed circuit board 100 while being perpendicular to the long side of the rigid-flex printed circuit board 100.

A timing controller 210 may be mounted on the rigid printed circuit board 200. The rigid printed circuit board 200 may be a control printed circuit board (C-PCB) for supplying information on an image to be displayed on a display device by supplying digital video data and timing signals, and controlling driving timing of the display device.

The plurality of flexible printed circuit cables 300 may be attached to the rigid portion 110 of the rigid-flex printed circuit board 100, so that one end in each of the plurality of flexible printed circuit cables 300 may be attached to a long side of the rigid portion 110 while being perpendicular to the long side of the rigid portion 110. FIG. 1 shows the two of flexible printed circuit cables 300, but not limited to this structure. The number of flexible printed circuit cables 300 may be more than two, or less than two.

The plurality of flexible printed circuit cables 300 electrically connect the rigid-flex printed circuit board 100 and the rigid printed circuit board 200 with each other. The plurality of flexible printed circuit cables 300 may be crooked, bent, or curved in various shapes. The plurality of flexible printed circuit cables 300 connect the rigid-flex printed circuit board 100 and the rigid printed circuit board 200 with each other, and enable various arrangements of the rigid-flex printed circuit board 100 and the rigid printed circuit board 200. Accordingly, a volume of the circuit board module for a display device can be reduced according to an aspect of the present disclosure, and the circuit board module for a display device with the reduced volume may be applied to various shapes of the display device.

Figure 2:
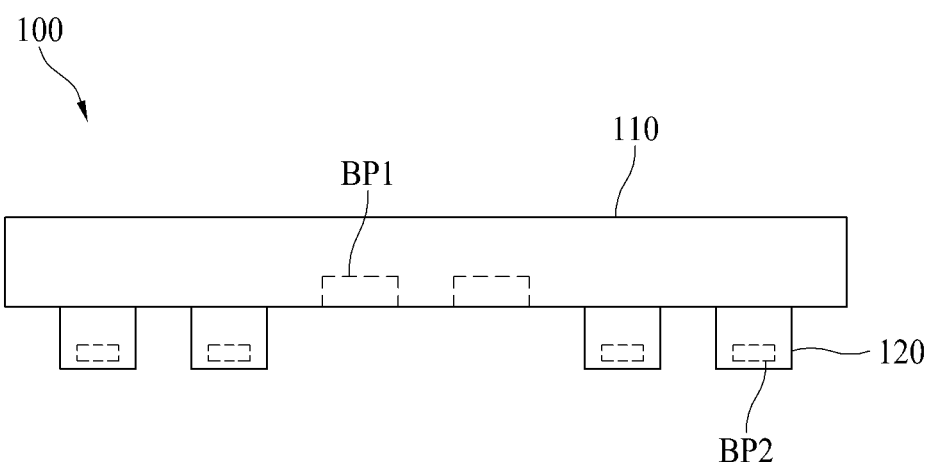
FIG. 2 is a plan view illustrating a rigid-flex printed circuit board according to an aspect of the present disclosure.

FIG. 2 is a plan view illustrating the rigid-flex printed circuit board 100 according to an aspect of the present disclosure.

The rigid-flex printed circuit board 100 according to an aspect of the present disclosure may include a plurality of first bonding pads (BP1) formed in the rigid portion 110, and a plurality of second bonding pads (BP2) formed in the plurality of flexible portions 120.

The first bonding pad (BP1) is disposed along the long side of the rigid portion 110. The first bonding pad (BP1) may be provided on a front surface or rear surface of the rigid portion 110. The first bonding pad (BP1) is electrically connected with the flexible printed circuit cable 300. Instead of forming the flexible printed circuit cable 300 and the rigid portion 110 as one body, the flexible printed circuit cable 300 may be formed separately, and then connected with the rigid portion 110 by an additional bonding process through the use of first bonding pad (BP1). This bonding process is referred to as a hot-bar bonding. The first bonding pad (BP1) is formed of metal or alloy with high electrical conductivity.

The second bonding pad (BP2) is formed at one side in each of the plurality of flexible portions 120. Specifically, the second bonding pad (BP2) may be formed at the side of the flexible portion 120, which is opposite to the side adjacent to the rigid portion 110. The second bonding pad (BP2) is electrically connected with the display panel 400. The plurality of flexible portions 120, which extend from the rigid portion 110, are manufactured at the same time, and the second bonding pad (BP2) is attached to the display panel 400 by an additional process. The second bonding pad (BP2) is formed of metal or alloy with high electrical conductivity.

The rigid-flex printed circuit board 100 may be electrically connected with the flexible printed circuit cable 300 and the display panel 400 by the use of first bonding pad (BP1) and second bonding pad (BP2). Accordingly, the rigid-flex printed circuit board 100 may supply an electrical signal from the flexible printed circuit cable 300 to the display panel 400.

Figure 3:
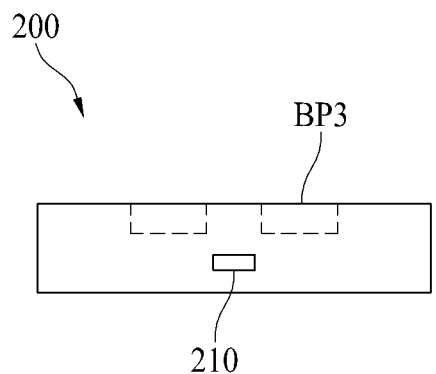
FIG. 3 is a plan view illustrating a rigid printed circuit board according to an aspect of the present disclosure.

FIG. 3 is a plan view illustrating the rigid printed circuit board 200 according to an aspect of the present disclosure.

The rigid printed circuit board 200 according to an aspect of the present disclosure may include a third bonding pad (BP3).

The third bonding pad (BP3) is disposed adjacent to the long side of the rigid printed circuit board 200. The third bonding pad (BP3) is attached to each of the plurality of flexible printed circuit cables 300. When the first bonding pad (BP1) is attached to one side of the flexible printed circuit cable 300, the third bonding pad (BP3) is attached to the opposite side of the flexible printed circuit cable 300, that is, the other side of the flexible printed circuit cable 300. Instead of forming the flexible printed circuit cable 300 and the rigid printed circuit board 200 as one body, the flexible printed circuit cable 300 may be formed separately, and then connected with the rigid printed circuit board 200 by an additional bonding process through the use of third bonding pad (BP3). This bonding process is referred to as a hot-bar bonding. The third bonding pad (BP3) is formed of metal or alloy with high electrical conductivity.

The rigid printed circuit board 200 may be electrically connected with the flexible printed circuit cable 300 by the use of third bonding pad (BP3). Accordingly, the rigid printed circuit board 200 may supply an electrical signal to the flexible printed circuit cable 300.

Figure 4:
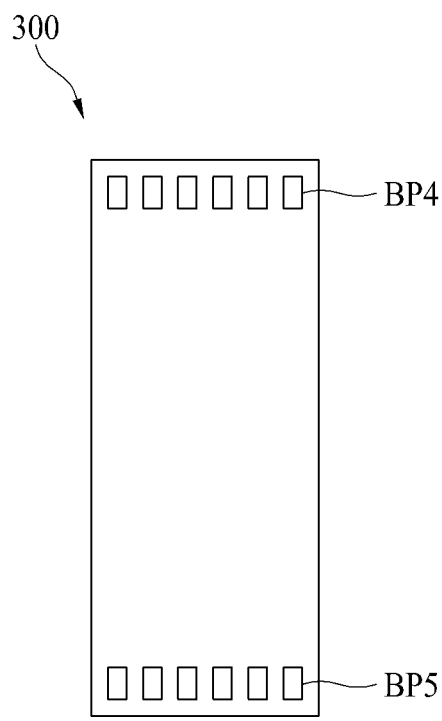
FIG. 4 is a plan view illustrating a flexible printed circuit cable according to an aspect of the present disclosure.

FIG. 4 is a plan view illustrating the flexible printed circuit cable 300 according to an aspect of the present disclosure.

The flexible printed circuit cable 300 may include a fourth bonding pad (BP4) attached to the first bonding pad (BP1), and a fifth bonding pad (BP5) attached to the third bonding pad (BP3).

The fourth bonding pad (BP4) is formed at one side of the flexible printed circuit cable 300, and is attached to the first bonding pad (BP1). The fourth bonding pad (BP4) is connected with the rigid-flex printed circuit board 100. The fourth bonding pad (BP4) is formed of metal or alloy with high electrical conductivity.

The fifth bonding pad (BP5) is formed at the other side of the flexible printed circuit cable 300, and is attached to the third bonding pad (BP3). The fifth bonding pad (BP5) is connected with the rigid printed circuit board 200. The fifth bonding pad (BP5) is formed of metal or alloy with high electrical conductivity.

The flexible printed circuit cable 300 electrically connects the rigid-flex printed circuit board 100 and the rigid printed circuit board 200 with each other by the use of fourth bonding pad (BP4) and fifth bonding pad (BP5). Accordingly, the flexible printed circuit cable 300 may supply electrical signals, which are generated in the rigid printed circuit board 200, to the rigid-flex printed circuit board 100.

Also, the flexible printed circuit cable 300 electrically connects the rigid-flex printed circuit board 100 and the rigid printed circuit board 200 with each other by the use of fourth bonding pad (BP4) and fifth bonding pad (BP5). Thus, instead of forming the flexible printed circuit cable 300 as one body with the rigid-flex printed circuit board 100 and the rigid printed circuit board 200, the flexible printed circuit cable 300 may be formed separately. Accordingly, it is possible to provide the flexible printed circuit cable 300 with a different material from those of the rigid-flex printed circuit board 100 and the rigid printed circuit board 200, to thereby improve the yield.

Figure 5:
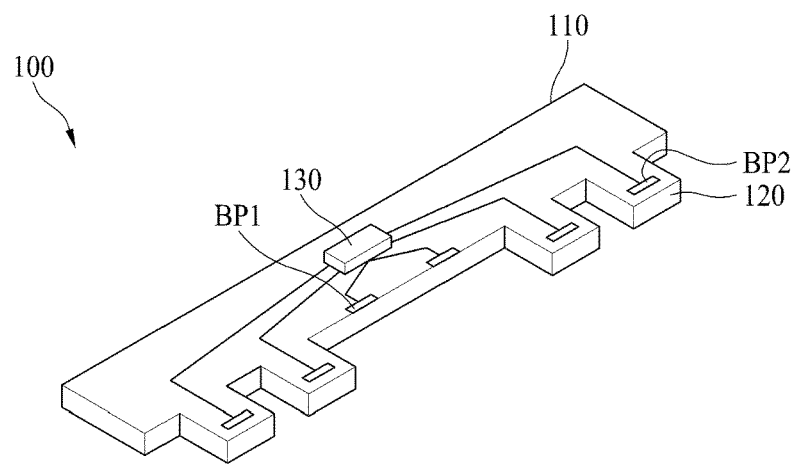
FIG. 5 is a perspective view illustrating a rigid-flex printed circuit board according to an aspect of the present disclosure.

FIG. 5 is a perspective view illustrating the rigid-flex printed circuit board 100 according to an aspect of the present disclosure.

The rigid-flex printed circuit board 100 according to an aspect of the present disclosure may include a flexible base film having a first area overlapping the rigid portion 110, and a plurality of second areas which protrudes from the first area while respectively overlapping the plurality of flexible portions 120.

The flexible base film is provided in both the rigid portion 110 and the flexible portion 120. As a curable PCB plate or a cover shield for stably maintaining a shape is deposited on the first area of the flexible base film corresponding to the rigid portion 110, the flexible base film in the rigid portion 110 becomes a rigid area. Meanwhile, as only the flexible base film is provided in the flexible portion 120, or a flexible circuit or a flexible chip is deposited on the second area of the flexible base film corresponding to the flexible portion 120, the flexible base film in the flexible portion 120 becomes a flexible area. The flexible base film may include a flexible material, for example, polyimide. In addition, the flexible base film may be formed of a material with flexibility.

In case of the flexible base film, the rigid portion 110 and the flexible portion 120 are not separated from each other, but are connected with each other. The rigid portion 110 and the flexible portion 120 may be continuously provided by the use of flexible base film, and formed as one body without using an additional connection member. Accordingly, when the flexible base film in the flexible portion 120 is connected with the display panel, the flexible portion 120 may be curved or bent due to a step difference (height difference) between the flexible portion 120 and the display panel. Even in this case, it is possible to reduce possibility of a separation between the rigid portion 110 and the flexible portion 120, and damages on the rigid portion 110 and the flexible portion 120.

The rigid-flex printed circuit board 100 according to an aspect of the present disclosure includes a driving wiring portion 130 with a wiring portion formed on the flexible base film, and the driving wiring portion 130 having at least one layer is connected with each of the plurality of first bonding pads (BP1) and the plurality of second bonding pads (BP2).

The driving wiring portion 130 includes a driving integrated circuit chip, and the wiring portion which extends from the driving integrated circuit chip, and is connected with each of the plurality of first bonding pads (BP1) and the plurality of second bonding pads (BP2). The wiring portion includes wiring lines for electrically connecting the driving integrated circuit chip with the plurality of first bonding pads (BP1) and the plurality of second bonding pads (BP2). The wiring line may include any one of conductive metal materials such as copper (Cu), aurums (Au), argentums (Ag), aluminum (Al), nickel (Ni), and tin (Sn), or their alloys.

Each of the first bonding pad (BP1) and the second bonding pad (BP2) supplies a signal from the wiring line to the driving integrated circuit chip, and receive a signal from the driving integrated circuit chip. Accordingly, the first bonding pad (BP1) and the second bonding pad (BP2) are electrically connected with each other, so that a signal can be exchanged between the first bonding pad (BP1) and the second bonding pad (BP2).

The rigid-flex printed circuit board 100 according to an aspect of the present disclosure may further include a protection layer for covering the driving wiring portion 130, and the protection layer may be formed on some portions of the first area, and some portions of the second area. The protection layer may be an encapsulation film, an insulating film, or an encapsulation film having the insulating properties. For example, the protection layer may be photo solder resist (PSR).

The protection layer according to an aspect of the present disclosure covers the remaining of the driving wiring portion 130 except for the plurality of first bonding pads (BP1) and the plurality of second bonding pads (BP2). In order to electrically connect the plurality of first bonding pads (BP1) and the plurality of second bonding pads (BP2) with the rigid printed circuit board 200 and the flexible printed circuit cable 300, the protection layer is not formed in the plurality of first bonding pads (BP1) and the plurality of second bonding pads (BP2).

If the driving wiring portion 130 is covered by the protection layer, it is possible to prevent a disconnection of the wiring line connected with the plurality of first bonding pads (BP1) and the plurality of second bonding pads (BP2). Also, if the driving wiring portion 130 is covered by the protection layer, it is possible to prevent the driving wiring portion 130 from being damaged by an external shock and to prevent foreign matters such as oxygen or moisture from being permeated into the driving wiring portion 130.

Figure 6:
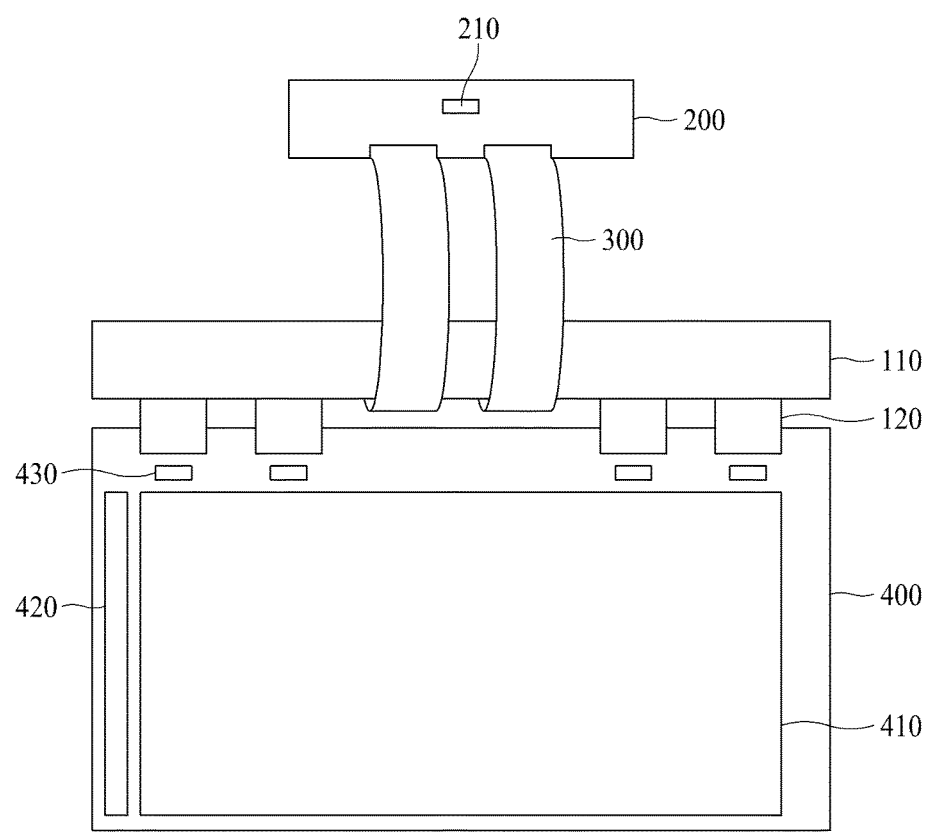
FIG. 6 is a plan view illustrating a display device according to an aspect of the present disclosure.

FIG. 6 is a plane view illustrating a display device according to an aspect of the present disclosure. The display device according to an aspect of the present disclosure may include a display panel 400, a display area 410, a gate driver 420, and a driving integrated circuit 430.

The display panel 400 according to an aspect of the present disclosure may include a plurality of gate and data lines crossing each other.

The plurality of gate lines is extending in a first horizontal axis direction of the display panel 400, and is provided at fixed intervals along a second horizontal axis direction which is perpendicular to the first horizontal axis direction.

The plurality of data lines is perpendicular to the plurality of gate lines. The plurality of data lines is extending in the second horizontal axis direction, and is provided at fixed intervals along the first horizontal axis direction.

Then, pixels are provided at respective crossing area of the gate and data lines. Each of the pixels is connected with the gate and data lines. Each pixel includes a thin film transistor and a storage capacitor. The thin film transistor is turned-on by a gate signal of the gate line, and the turned-on thin film transistor supplies a data voltage of the data line to the pixel.

The display panel 400 may include the display area 410 and a non-display area. In the display area 410, there are the gate and data lines crossing each other, and pixel areas are defined by the crossing areas of the gate and data lines. An image may be displayed on the pixel areas of the display area 410.

The non-display area is provided in the periphery of the display area 410. In more detail, the non-display area may be the remaining area except for the display area 410 of the display panel 400. The non-display area may be the lower, upper, left, and right borders of the display panel 400.

The display panel 400 is provided with a panel pad portion and a chip mounting portion. The panel pad portion is formed in the non-display area of the display panel 400. FIG. 6 shows that the panel pad portion is formed in the non-display area of the upper border of the display panel 400.

The gate driver 420 generates the gate signal in accordance with a gate timing control signal supplied from the timing controller 210, and supplies the generated gate signal to the gate line. The gate driver 420 according to an aspect of the present disclosure may be formed as a gate-in-panel (GIP) circuit in the non-display area of the display panel 400.

The GIP circuit together with the thin film transistor of the pixel may be provided inside the non-display area of the display panel 400. For example, the gate driver 420 of the GIP circuit may be prepared at one side, at the other side, or at both sides of the display area 410, but not limited to this structure. The gate driver 420 of the GIP circuit may be prepared in any area of the non-display area enabling the supply of the gate signal to the gate line.

Each of the plurality of driving integrated circuits 430 may be mounted on the chip mounting portion inside the display panel 400. The chip mounting portion is formed between the panel pad portion and the display area 410. Each of the plurality of driving integrated circuits 430 receives digital video data and data timing control signal from the timing controller 210, converts the digital video data into an analog data voltage in accordance with the data timing control signal, and supplies the analog data voltage to the data lines. Each of the plurality of driving integrated circuits 430 may be mounted on the chip mounting portion by chip on glass (COG) or chip on plastic (COP) method.

Each of the plurality of flexible printed circuit cables 300 is attached to the panel pad portion prepared in the display panel 400. In this case, each of the plurality of flexible printed circuit cables 300 is attached onto the panel pad portion by the use of anisotropic conducting film (ACF). Each of the flexible printed circuit cables 300 supplies the digital video data and data timing control signal from the timing controller 210 to the driving integrated circuit 430 through the panel pad portion. Also, at least one among the plurality of flexible printed circuit cables 300 supplies the gate timing control signal from the timing controller 210 to the gate driver 420. The plurality of flexible printed circuit cables 300 may be curved smoothly. In order to realize a small size of the display device, the flexible printed circuit cable 300 may be bent upward to overlap the rigid printed circuit board 200.

The timing controller 210, which is mounted on the rigid printed circuit board 200, receives digital video data and timing synchronization signals from an external system board. In this case, the timing synchronization signals may include a vertical synchronization signal (vertical sync signal) for defining one frame period, a horizontal synchronization signal (horizontal sync signal) for defining one horizontal period, a data enable signal for indicating whether data is valid, and a dot clock corresponding to a clock signal with a predetermined cycle.

The timing controller 210 generates the gate timing control signal for controlling operation timing of the gate driver 420, and the data timing control signal for controlling the driving integrated circuits 430 on the basis of timing synchronization signals. The timing controller 210 supplies the gate timing control signal to the gate driver 420, and supplies the data timing control signal to the plurality of driving integrated circuits 430.

Figure 7:
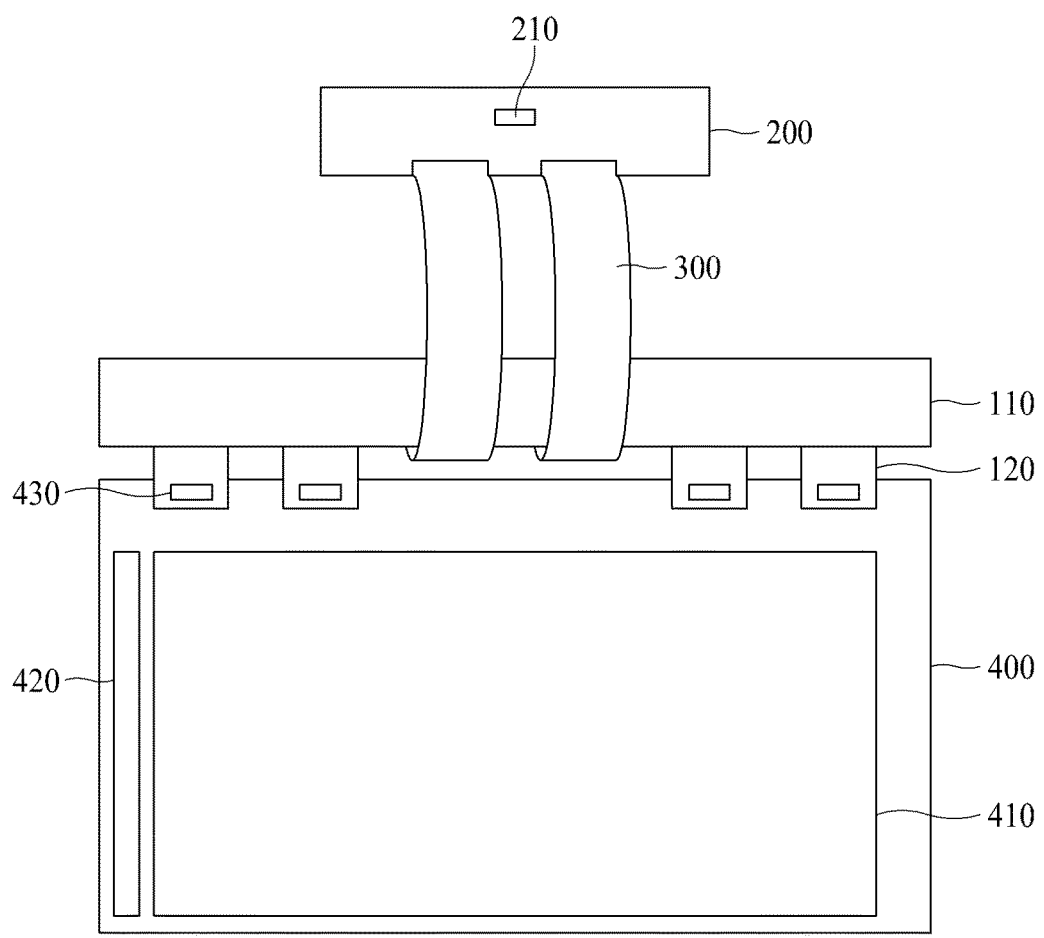
FIG. 7 is a plan view illustrating a display device according to another aspect of the present disclosure.

FIG. 7 is a plan view illustrating a display device according to another aspect of the present disclosure. Except for a plurality of driving integrated circuits 430, the display device according to another aspect of the present disclosure shown in FIG. 7 is identical to the display device according to an aspect of the present disclosure shown in FIG. 6, and a detailed description for the same parts will be omitted.

In case of the display device according to another aspect of the present disclosure, each of the plurality of driving integrated circuits 430 is mounted on each of a plurality of flexible portions 120. Each of the plurality of driving integrated circuits 430 receives digital video data and a data timing control signal from a timing controller 210, converts the digital video data into an analog data voltage in accordance with the data timing control signal, and supplies the analog data voltage to data lines. Each of the plurality of driving integrated circuits 430 may be mounted on the flexible portion 120 by chip on film (COF) method.

Figure 8:
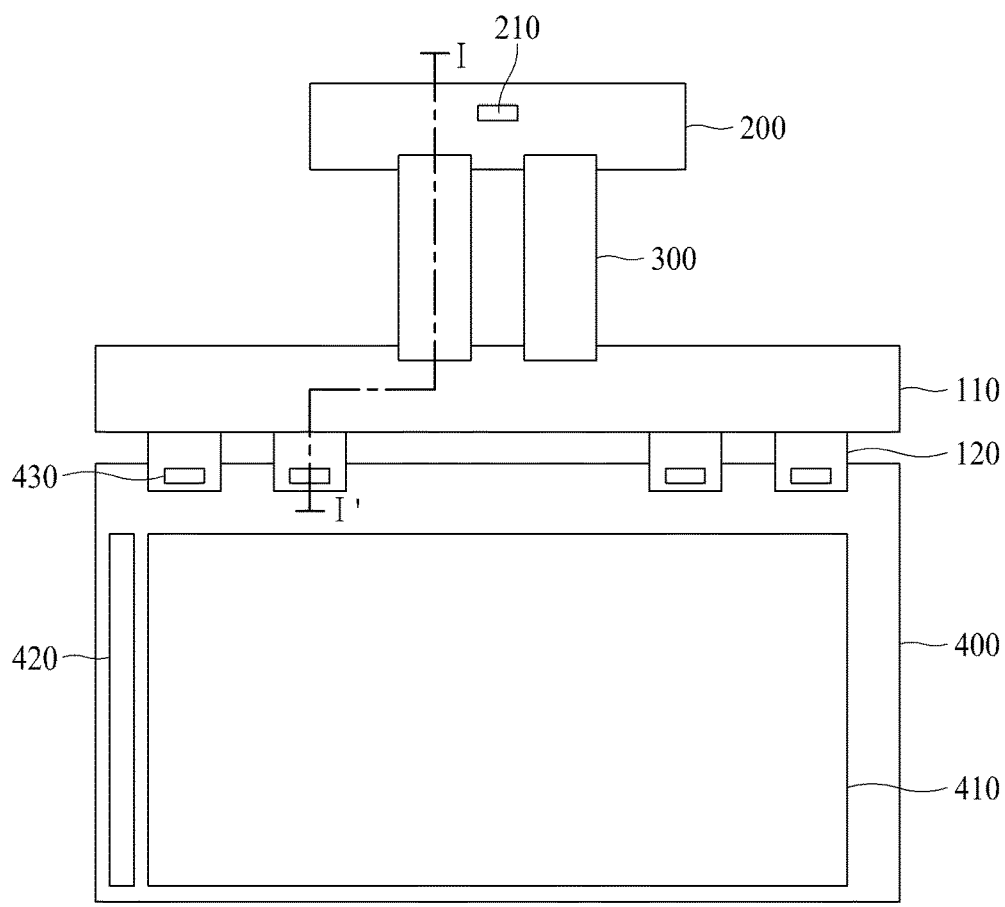
FIG. 8 is a plan view illustrating a display device according to yet another aspect of the present disclosure.

FIG. 8 is a plan view illustrating a display device according to yet another aspect of the present disclosure. Except for a flexible printed circuit cable 300, the display device according to yet another aspect of the present disclosure shown in FIG. 8 is identical to the display device according to another aspect of the present disclosure shown in FIG. 7, and a detailed description for the same parts will be omitted.

In the display device according to yet another aspect of the present disclosure, the flexible printed circuit cable 300 is not curved, and is connected between a rigid printed circuit board 200 and a rigid portion 110 of a rigid-flex printed circuit board. In this case, a connection portion between the flexible printed circuit cable 300 and the rigid portion 110 of the rigid-flex printed circuit board is arranged in an opposite direction to a connection portion between the flexible printed circuit cable 300 and the rigid printed circuit board 200. Also, the connection portion between the flexible printed circuit cable 300 and the rigid portion 110 of the rigid-flex printed circuit board is arranged in an opposite direction to a protruding direction of a flexible portion 120.

Figure 9:
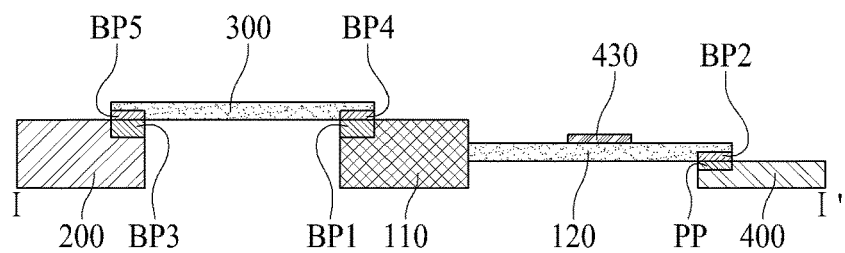
FIG. 9 is a cross-sectional view taken along line I-I' of FIG. 8.

FIG. 9 is a cross sectional view taken along line I-I' of FIG. 8. Hereinafter, a structure along I-I' will be described sequentially.

A third bonding pad (BP3) is formed at one corner of the rigid printed circuit board 200. The third bonding pad (BP3) is in contact with a fifth bonding pad (BP5) prepared at one corner of the flexible printed circuit cable 300. Accordingly, the rigid printed circuit board 200 and the flexible printed circuit cable 300 are electrically connected with each other.

A first bonding pad (BP1) is formed at one corner of the rigid portion 110 of the rigid-flex printed circuit board. The first bonding pad (BP1) is in contact with a fourth bonding pad (BP4) formed at the other corner of the flexible printed circuit cable 300. Accordingly, the rigid portion 110 of the rigid-flex printed circuit board and the flexible printed circuit cable 300 are electrically connected with each other.

As shown in FIG. 9, a height of an upper surface in the rigid portion 110 of the rigid-flex printed circuit board is the same as a height of an upper surface in the rigid printed circuit board 200. In this case, the rigid portion 110 of the rigid-flex printed circuit board and the rigid printed circuit board 200 are electrically connected with each other by the flexible printed circuit cable 300 which is in a flat state, but not limited to this structure. For example, a height of an upper surface in the rigid portion 110 of the rigid-flex printed circuit board may be higher than a height of an upper surface in the rigid printed circuit board 200. In this case, the rigid portion 110 of the rigid-flex printed circuit board and the rigid printed circuit board 200 may be electrically connected with each other by the flexible printed circuit cable 300 which is in a bent state.

The flexible portion 120 of the rigid-flex printed circuit board extends from any one layer of the center of the rigid portion 110. In detail, the flexible portion 120 extends from a flexible base film of the rigid portion 110. A driving integrated circuit 430 may be mounted on the flexible portion 120.

A second bonding pad (BP2) is formed at one corner of the flexible portion 120 of the rigid-flex printed circuit board. The second bonding pad (BP2) is in contact with a panel pad portion (PP) formed at one corner of a display panel 400. Accordingly, the flexible portion 120 of the rigid-flex printed circuit board and the display panel 400 are electrically connected with each other.

A method for manufacturing the circuit board module for a display device according to an aspect of the present disclosure may include manufacturing the rigid-flex printed circuit board 100 having the rigid portion 110 and the plurality of flexible portions 120 by the use of first mother board (MB1), manufacturing the rigid printed circuit board 200 by the use of second mother board (MB2), manufacturing the plurality of flexible printed circuit cables 300 by the use of third mother board (MB3), and attaching the plurality of flexible printed circuit cables 300 to the rigid printed circuit board 200 and the rigid portion 110 of the rigid-flex printed circuit board 100.

Figure 10:
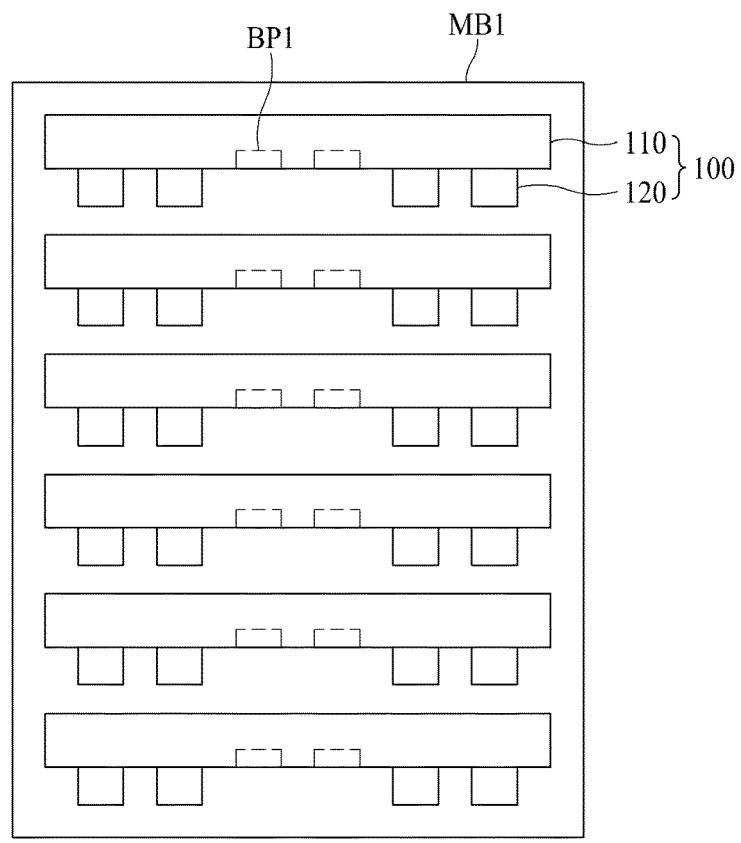
FIG. 10 is a plan view illustrating a first mother board in a method for manufacturing a circuit board module for a display device according to an aspect of the present disclosure.

FIG. 10 is a plan view illustrating the first mother board (MB1) according to a method for manufacturing the circuit board module for a display device according to an aspect of the present disclosure.

The rigid-flex printed circuit board 100 having the rigid portion 110 and the plurality of flexible portions 120 is manufactured on the first mother board (MB1). The rigid-flex printed circuit board 100 includes the rigid portion 110 and the plurality of flexible portions 120, and the first bonding pad (BP1) is formed in the rigid portion 110. The plurality of rigid-flex printed circuit boards 100 may be manufactured at the same time on the first mother board (MB1). The rigid-flex printed circuit board 100 has a rectangular shape with relatively-slight protrusions. Thus, if manufacturing only the rigid-flex printed circuit boards 100 on the first mother board (MB1), it is possible to maximize spatial efficiency of the first mother board (MB1) when manufacturing the rigid-flex printed circuit boards 100.

Figure 11:
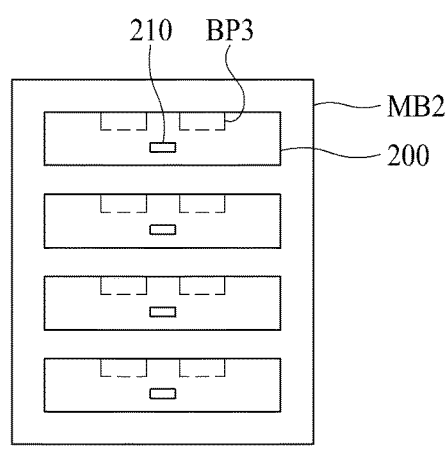
FIG. 11 is a plan view illustrating a second mother board in a method for manufacturing a circuit board module for a display device according to an aspect of the present disclosure.

FIG. 11 is a plan view illustrating the second mother board (MB2) according to a method for manufacturing the circuit board module for a display device according to an aspect of the present disclosure.

The rigid printed circuit board 200 is manufactured on the second mother board (MB2). The third bonding pad (BP3) may be formed in the rigid printed circuit board 200, and the timing controller 210 may be mounted on the rigid printed circuit board 200. The plurality of rigid printed circuit boards 200 may be manufactured at the same time on the second mother board (MB2). The rigid printed circuit board 200 has a rectangular shape. Thus, if manufacturing only the rigid printed circuit boards 200 on the second mother board (MB2), it is possible to maximize spatial efficiency of the second mother board (MB2) when manufacturing the rigid printed circuit boards 200.

Figure 12:
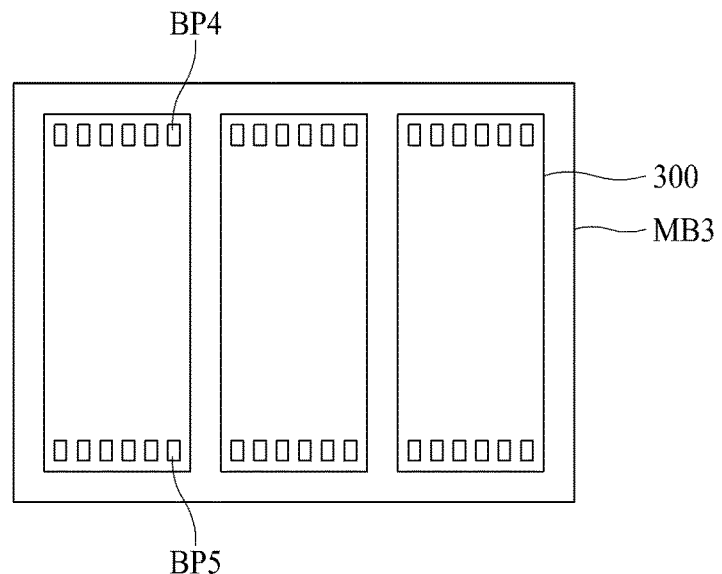
FIG. 12 is a plan view illustrating a third mother board in a method for manufacturing a circuit board module for a display device according to an aspect of the present disclosure.

FIG. 12 is a plan view illustrating the third mother board (MB3) according to a method for manufacturing the circuit board module for a display device according to an aspect of the present disclosure.

The flexible printed circuit cable 300 is manufactured on the third mother board (MB3). The fourth bonding pad (BP4) is formed at one side of the flexible printed circuit cable 300, and the fifth bonding pad (BP5) is formed at the other side of the flexible printed circuit cable 300. The plurality of flexible printed circuit cables 300 may be manufactured at the same time on the third mother board (MB3). The flexible printed circuit cable 300 has a rectangular shape. Thus, if manufacturing only the flexible printed circuit cables 300 on the third mother board (MB3), it is possible to maximize spatial efficiency of the third mother board (MB3) when manufacturing the flexible printed circuit cables 300.

In the method for manufacturing the circuit board module for a display device according to one aspect of the present disclosure, the first mother board (MB1) is the rigid mother board with the flexible base film provided therein, the second mother board (MB2) is the rigid mother board, and the third mother board (MB3) is the flexible mother board.

The first mother board (MB1) is formed of the rigid mother board provided with the flexible base film therein so as to manufacture the rigid-flex printed circuit board 100. The rigid portion 110 of the rigid-flex printed circuit board 100 includes all layers provided in the rigid mother board, and the flexible portion 120 include only the flexible base film by removing rigid layers from the rigid mother board.

The second mother board (MB2) is formed of the rigid mother board so as to manufacture the rigid printed circuit board 200. The third mother board (MB3) is formed of the flexible mother board so as to manufacture the flexible printed circuit cable 300.

If the kind of mother board is determined based on the kind of elements to be manufactured on the mother board, it is possible to manufacture the plurality of elements at the same time on the mother board. Especially, if the different kinds of elements are respectively manufactured on the first to third mother boards (MB1~MB3) according to an aspect of the present disclosure, the kind of each of the first to third mother boards (MB1~MB3) is determined based on the kind of elements to be manufactured on each mother board, which enables to realize a simplified manufacturing process.

Figure 13:
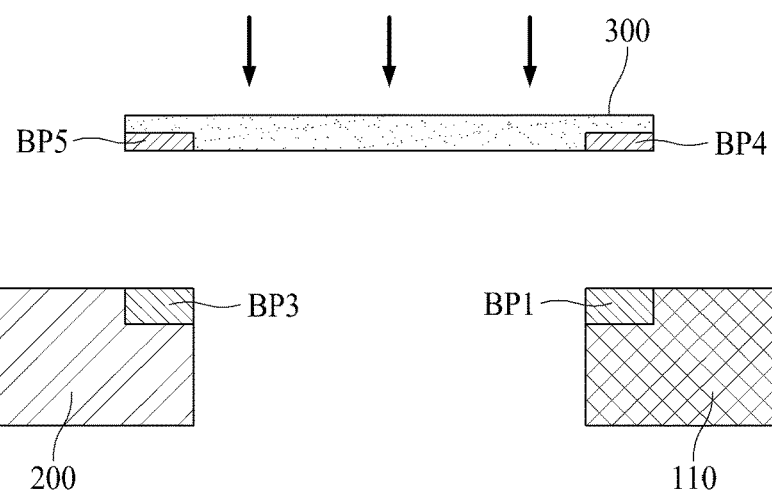
FIG. 13 is a lateral side view illustrating a process of attaching a flexible printed circuit cable to a rigid portion of a rigid-flex printed circuit board and a rigid printed circuit board in a method for manufacturing a circuit board module for a display device according to an aspect of the present disclosure.

FIG. 13 is a lateral side view illustrating a process of attaching the flexible printed circuit cable 300 to the rigid portion 110 of the rigid-flex printed circuit board 100 (shown in FIG. 9) and the rigid printed circuit board 200 in a method for manufacturing the circuit board module for a display device according to an aspect of the present disclosure.

Each of the rigid-flex printed circuit board 100, the rigid printed circuit board 200, and the flexible printed circuit cable 300 constituting the circuit board module for a display device is manufactured on each mother board.

The first bonding pad (BP1) is prepared at one corner of the rigid portion 110 of the rigid-flex printed circuit board 100, and the third bonding pad (BP3) is prepared at one corner of the rigid printed circuit board 200. Also, the fourth bonding pad (BP4) is prepared at one corner of the flexible printed circuit cable 300, and the fifth bonding pad (BP5) is prepared at the other corner of the flexible printed circuit cable 300.

When the flexible printed circuit cable 300 is attached onto rigid portion 110 of the rigid-flex printed circuit board and the rigid printed circuit board 200, one corner of the flexible printed circuit cable 300 is arranged to correspond to one corner of the rigid portion 110, and the other corner of the flexible printed circuit cable 300 is arranged to correspond to one corner of the rigid printed circuit board 200. In this case, the first bonding pad (BP1) is attached to the fourth bonding pad (BP4), and the third bonding pad (BP3) is attached to the fifth bonding pad (BP5). The method for attaching the bonding pads to each other may be the hot-bar bonding method. If applying the hot-bar bonding method, the circuit boards may be manufactured separately, and then electrically connected with each other, instead of manufacturing the circuit boards by one process, According to an aspect of the present disclosure, the rigid-flex printed circuit board, the rigid printed circuit board, and the flexible printed circuit cable are respectively manufactured on the different mother boards, separately, and then combined with one another, whereby it is possible to realize the more-improved spatial efficiency of the mother board in comparison to a case of manufacturing the rigid-flex printed circuit board, the rigid printed circuit board, and the flexible printed circuit cable on one mother board.

According to an aspect of the present disclosure, the rigid-flex printed circuit board, the rigid printed circuit board, and the flexible printed circuit cable are respectively manufactured on the different mother boards so that it is possible to simplify the structure of the mother board in accordance with the element to be provided on each mother board.

According to an aspect of the present disclosure, the circuit board module for a display device with the rigid-flex circuit board structure, the display device including the same, and the method for manufacturing the same may be embodied by the hot-bar bonding method.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A circuit board module for a display device comprising:
    a rigid-flex printed circuit board having a rigid portion and a plurality of flexible portions and including a flexible base film that has a first area overlapping the rigid portion and a plurality of second areas laterally protruding from the first area and overlapping the plurality of flexible portions to engage the rigid portion with the plurality of flexible portions as one body without an additional connection member;
    a plurality of flexible printed circuit cables attached to the rigid portion of the rigid-flex printed circuit board; and
    a rigid printed circuit board electrically connected to the rigid-flex circuit board through the plurality of flexible printed circuit cables.

2. The circuit board module according to claim 1, wherein the rigid-flex printed circuit board includes:
    a plurality of first bonding pads in the rigid portion.

3. The circuit board module according to claim 2, wherein the rigid-flex printed circuit board further includes:
    a driving wiring portion having a wiring portion on the flexible base film, wherein the wiring portion is connected with each of the plurality of first bonding pads and the plurality of second bonding pads; and
    a protection layer covering the driving wiring portion including the wiring portion, and portions of the first area and portions of the second area except for the plurality of first bonding pads and the plurality of second bonding pads.

4. The circuit board module according to claim 2, further comprising a timing controller mounted on the rigid printed circuit board.

5. The circuit board module according to claim 1, wherein the rigid printed circuit board includes a third bonding pad attached to the plurality of flexible printed circuit cables.

6. The circuit board module according to claim 5, wherein the plurality of flexible printed circuit cables include:
    a fourth bonding pad attached to the first bonding pad; and
    a fifth bonding pad attached to the third bonding pad.

7. A display device comprising:
    a display panel having a panel pad portion and a chip mounting portion;
    a driving integrated circuit on the chip mounting portion; and
    a circuit board module connected with the panel pad portion, wherein the circuit board module comprises a rigid-flex printed circuit board having a rigid portion and a plurality of flexible portions and including a flexible base film that has a first area overlapping the rigid portion, and a plurality of second areas laterally protruding from the first area and overlapping the plurality of flexible portions to engage the rigid portion with the plurality of flexible portions as one body without an additional connection member; a plurality of flexible printed circuit cables attached to the rigid portion of the rigid-flex printed circuit board; and a rigid printed circuit board electrically connected to the rigid-flex circuit board through the plurality of flexible printed circuit cables.

8. The display device according to claim 7, wherein the rigid-flex printed circuit board includes a plurality of first bonding pads in the rigid portion and a plurality of second bonding pads in the plurality of flexible portions.

9. The display device according to claim 8, wherein the rigid-flex printed circuit board further comprises:
    a driving wiring portion having a wiring portion on the flexible base film, wherein the wiring portion is connected with each of the plurality of first bonding pads and the plurality of second bonding pads; and
    a protection layer covering the driving wiring portion including the wiring portion, and portions of the first area and portions of the second area except for the plurality of first bonding pads and the plurality of second bonding pads.

10. The display device according to claim 8, further comprising a timing controller mounted on the rigid printed circuit board.

11. The display device according to claim 7, wherein the rigid printed circuit board includes a third bonding pad attached to the plurality of flexible printed circuit cables.

12. The display device according to claim 11, wherein the plurality of flexible printed circuit cables include a fourth bonding pad attached to the first bonding pad and a fifth bonding pad attached to the third bonding pad.

13. A method for manufacturing a circuit board module for a display device comprising:
    forming a rigid-flex printed circuit board having a rigid portion and a plurality of flexible portions on a first mother board, and including a flexible base film that has a first area overlapping the rigid portion, and a plurality of second areas laterally protruding from the first area and overlapping the plurality of flexible portions to engage the rigid portion with the plurality of flexible portions as one body without an additional connection member;

forming a rigid printed circuit board on a second mother board;

forming a plurality of flexible printed circuit cables on a third mother board; and attaching the plurality of flexible printed circuit cables to the rigid portion of the rigid-flex printed circuit board and the rigid printed circuit board.

14. The method according to claim 13, wherein the first mother board is a rigid mother board having a flexible base film, the second mother board is a rigid mother board, and the third mother board is a flexible mother board.

15. The method according to claim 13, wherein the rigid-flex printed circuit board includes a plurality of first bonding pads in the rigid portion and a plurality of second bonding pads in the plurality of flexible portions.

16. The method according to claim 15, wherein the rigid-flex printed circuit board comprises:

a driving wiring portion having a wiring portion on the flexible base film, wherein the wiring portion is connected with each of the plurality of first bonding pads and the plurality of second bonding pads; and a protection layer covering the driving wiring portion including the wiring portion, and portions of the first area and portions of the second area except for the plurality of first bonding pads and the plurality of second bonding pads.

17. The method according to claim 13, wherein the rigid printed circuit board includes a third bonding pad attached to the plurality of flexible printed circuit cables.

18. The method according to claim 17, wherein the plurality of flexible printed circuit cables include a fourth bonding pad attached to the first bonding pad and a fifth bonding pad attached to the third bonding pad.

19. The method according to claim 18, wherein the fourth and fifth bonding pads are respectively attached to the first and third bonding pads through a hot-bar bonding method.

20. The method according to claim 13, further comprising a timing controller on the rigid printed circuit board.

* * * * *